(12) United States Patent
Nightingale et al.

(10) Patent No.: US 6,600,330 B1
(45) Date of Patent: Jul. 29, 2003

(54) PROBE HEAD HOLDER

(75) Inventors: Mark W. Nightingale, Washougal, WA (US); Marc A. Gessford, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/047,558

(22) Filed: Jan. 11, 2002

(51) Int. Cl.⁷ .............................................. G01R 31/02
(52) U.S. Cl. .................... 324/754; 324/72.5; 324/158.1
(58) Field of Search ............................... 324/72.5, 761, 324/754, 758, 158.1, 755, 757; 439/66, 482, 912.1

(56) References Cited

U.S. PATENT DOCUMENTS 3,992,073 A * 11/1976 Buchoff et al. ............... 439/86
5,015,947 A * 5/1991 Chism ........................ 324/754
5,223,787 A * 6/1993 Smith et al. ................. 324/758
5,387,872 A * 2/1995 Nightingale ................. 324/538
5,877,622 A * 3/1999 Aoyama et al. ......... 324/158.1

* cited by examiner

*Primary Examiner*—Kamand Cuneo
*Assistant Examiner*—Jimmy Nguyen
(74) *Attorney, Agent, or Firm*—William K. Bucher

(57) ABSTRACT

A probe head holder for a measurement probe head has a probe head mount and a highly elastic, high hoop strength retention member that flexibly secures the measurement probe head to the probe head holder. The probe head mount has a first surface adapted to receive the measurement probe head and a second surface extending from the first surface having at least a first groove formed therein normal to the first surface. The retention member is positioned around the holder and the probe head with a portion of the retention member being disposed in the groove. The probe head holder may be attached to a probe arm of a probing station.

17 Claims, 4 Drawing Sheets

PROBE HEAD HOLDER

BACKGROUND OF THE INVENTION

The present invention relates generally to probing systems and more particularly to a probe head holder for a measurement probe that is attachable to a probing arm of a probing system.

Hand held measurement probes are used to acquire electrical signals from component leads and test points of a device under test and couple these signals to a measurement instrument, such as an oscilloscope, logic analyzer and the like. These probes are also used in conjunction with probing stations to acquire signals from integrated circuit wafers and packages, surface mounted components and test points. The probing station has a probe arm on which is rotatably attached a probe head holder. The probe head holder includes a probe head mount and associated attachment hardware to secure the probe head to the probe head mount. The probe head of the measurement.probe is attached to the holder and the arm is positioned over the device under test such that the probe tip or tips of the measurement probe are positioned on the electrical contact of the device being tested. The positioning of the probe arm and the placement of the probe on the device under test is most often performed by a user using a magnifying device.

There are a number of different ways that a probe head is attached to the probe head holder. The probe head holder of the EZ Probe Arm, manufactured and sold by Cascade Microtech, Beaverton, Oreg., has a grooved-block probe head mount and screw down clamps. The probe head is positioned in the groove and the metal clamps are positioned across the probe head and screwed into the mount. The EZ Probe arm includes a joy stick in a base that positions the probe on the device under test. The probe head holder for the PPM203B Articulated Arm, sold by Tektronix, Inc., Beaverton, Oreg., has a probe head holder with a slotted hole that receives the probe head. One side of the slot has a threaded aperture that receives a screw that is inserted through a second aperture formed in the other side of the slot. The probe head is secured in the probe head mount hole by tightening the screw in the slot. Probe head holders having different holes sizes and shapes may be attached to the articulated arm to accept different sized and shaped probe heads.

Users have adapted the existing probe head holders by using binder clips, such as manufactured by Acco USA, Inc., Wheeling Ill., to secure the probe heads to the probe head mounts without using the attachment devices of the holders. This adaption allows the probe head to be quickly and securely attached to the probe head mount. User have also used zip ties to secure the probe head to existing probe head holders. A drawback to using zip ties is that the ties have to be cut to free the probe from the holder. It is also possible to use rubber bands to secure probe heads to probe head mounts but, because of the low hoop strength of rubber bands, it would require a large number of rubber bands to adequately secure a probe head to a probe head mount. Looping a large rubber band multiple times around a probe head and probe head mount is also possible but the user runs the risk of damaging the probe tips with each loop of the ruber band and stabbing oneself with the probe tips. Additionally, removing the probe head from the probe head mount would entail removing multiple rubber bands or multiple loops of a large rubber band with the attendant possibility of damaging the probe or the user.

A drawback to the existing probe head holders and the adaptions made by users is the rigidity of the probe heads in the probe head mounts. This is a particular drawback when using probes with closely spaced signal and ground probing tips and differential probes. The probing arm of existing probe stations is movable in the X-Y-Z directions, but may need rotational movement in the vertical plane to place the both probe tips on the device under test. This is accomplished by loosening the probe head holder at the end of the probe arm and rotating it to place the probe tips parallel to the device under test. Since very slight movement of the probing arm requires repositioning the probe head, the rotational adjustment of the probe head holder causes additional time to be expended for making measurements.

What is needed is a probe head holder for a probe arm that allows rotational movement of the probe head without having to re-adjust the position of the probe arm holder. Further, the probe head holder needs to be easily configurable with different types of probe heads.

SUMMARY OF THE INVENTION

Accordingly, the present invention is to a probe head holder usable with a probing arm of a probing station. The probe head holder has a probe head mount with a first surface adapted to receive the measurement probe head and a second surface, extending from the first surface, having at least a first groove formed therein normal to the first surface. At least a first highly elastic, high hoop strength retention member is disposed around the probe head mount and measurement probe head with a first portion disposed within the first groove in the probe head mount and a second portion disposed against the measurement probe head to flexibly secure the probe head to the mount.

In the preferred embodiment, the first surface of the probe head mount is substantially flat and the second surface is substantially round. The probe head mount has proximate and distal ends with the second surface extending over the first surface at the proximate end forming a transition extending upward from and normal to the first surface and the first and second surfaces tapering from a first dimension to a smaller second dimension at the distal end. The probe head mount is receivable in a probing arm by an attachment member disposed at the proximate end of the probe head mount. In the preferred embodiment, the attachment member has a shaft with an aperture formed therethrough that is received in a bore formed in the proximate end of the probe head mount that is parallel to the ends of the mount. Slots are formed on either side of the probe head mount that intersect the bore. A spring is disposed within the bore that engages the shaft to provide an axial spring force for the mount. A pin is disposed in the shaft aperture that engages the slots for securing the attachment member to the mount.

The highly elastic, high hoop strength retention member is preferably an elastomer ring and more specifically a castration ring used in the cattle and sheep industry. More than one groove may be formed in the second surface normal to the first surface for receiving more an one highly elastic, high hoop strength retention member. Further, the first surface of the probe head mount can have angles surfaces forming a groove that receives the probe head and the second surface may take other shapes, such as oval, rectangular, square or the like.

The objects, advantages and novel features of the present invention are apparent from the following detailed description when read in conjunction with appended claims and attached drawings.

BRIEF DESCRIPTION OF THE DRAWING FIGURES

DETAILED DESCRIPTION OF THE PREFERRED EMBODIMENT

Figure 1:
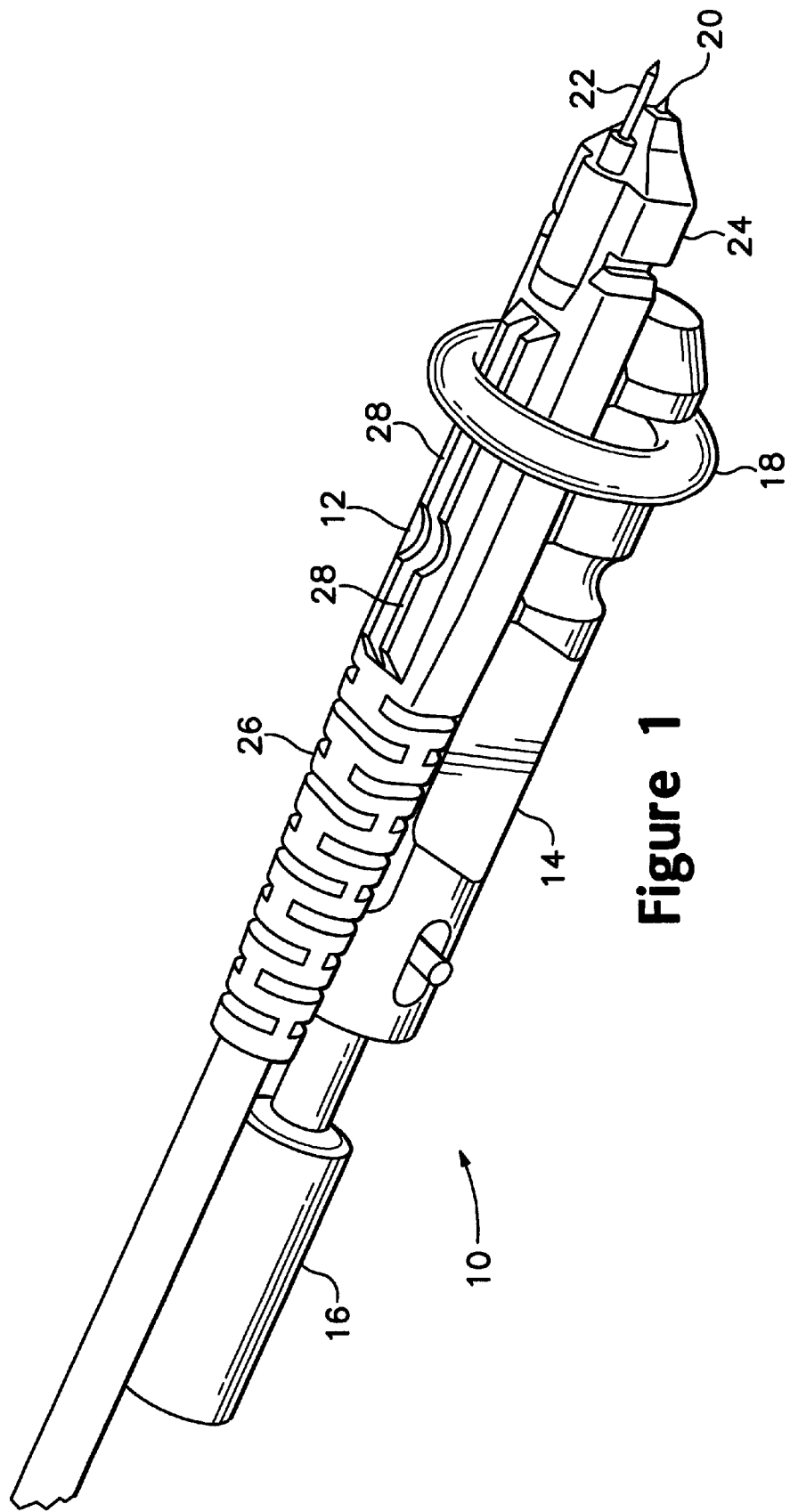
FIG. 1 is a perspective view of a measurement probe mounted on the probe head holder according to the present invention.

Referring to FIG. 1, there is shown a perspective view of the probe head holder 10 of the present invention having a measurement probe head 12 flexibly secured on a probe head mount 14 of the holder 10. The probe head holder 10 is designed to be attached to a probing arm of a probing system using an attachment member 16 extending from one end of a probe head mount 14. A highly elastic, high hoop strength retention member 18 is positioned over the probe head mount 14 and the probe head 12 to flexibly secure the probe to the mount.

The probe head holder 10 may be used with a variety of probe heads. As an example, FIG. 1 illustrates a probe head having a signal probing point 20 for acquiring signals from a device under test and a ground probing point 22 closely positioned adjacent to the signal probing point. The probing points 20, 22 extend from a probe tip holder 24 positioned at one end of the probe head 12. The probe head 12 has a substantially rectangular shape with a tapered transmission cable strain relief 26 extending from the other end of the holder 10. The probe head 12 is configured with parallel raised ribs 28 that are aligned with the long axis of the probe head 12. The probe head 12 may also be a differential type probe having two closely spaced signal probing tips extending from the probe tip holder. The probe head holder 10 may also be used with non-rectangular shaped probe heads, such as round, elliptical shaped probe heads or the like.

Figure 2:
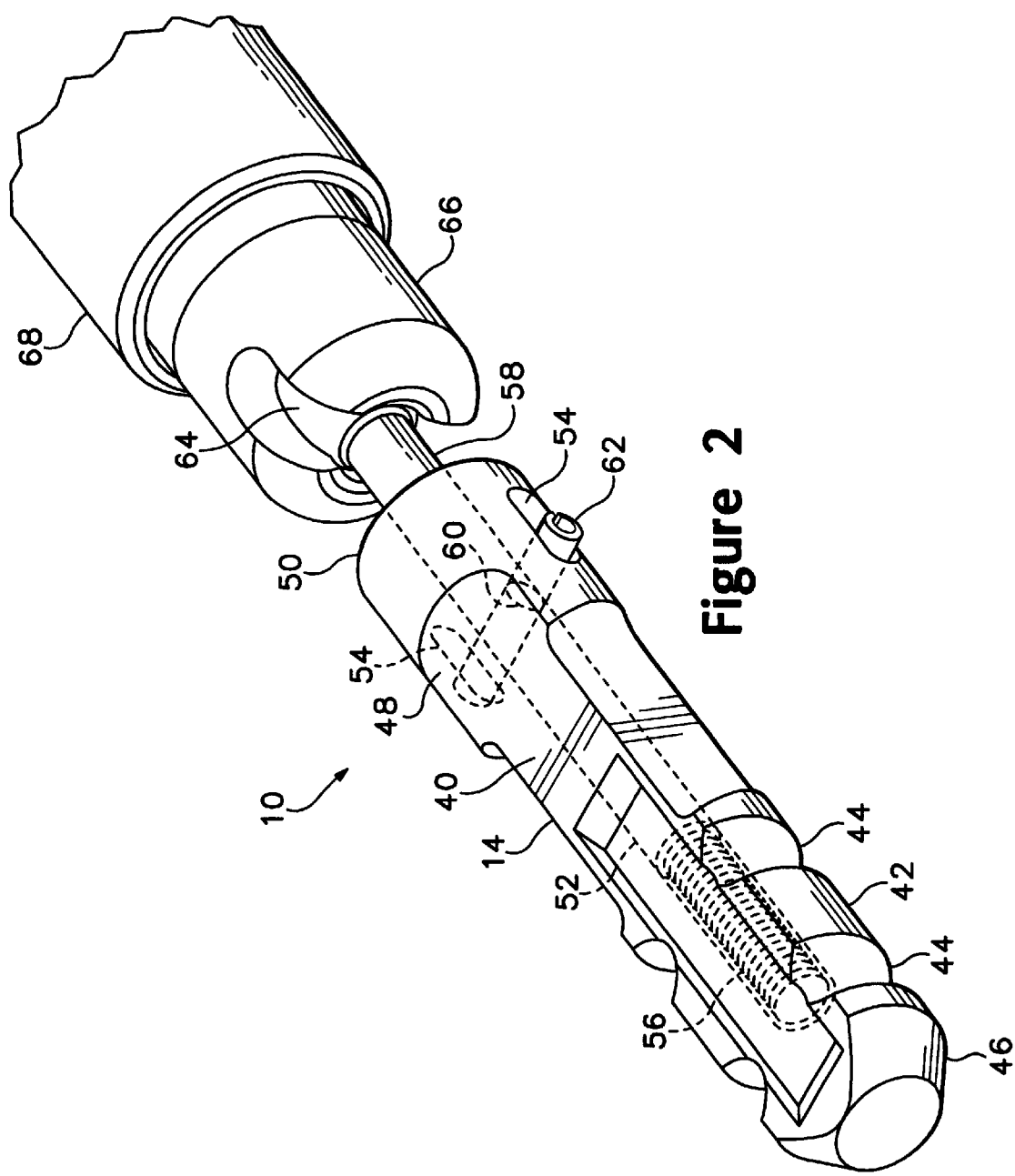
FIG. 2 is a perspective view of the probe head holder according to the present invention.

FIG. 2 is a perspective view of a first embodiment of the probe head holder 10 of the present invention. The probe head mount 14 has an substantially flat first surface 40 that receives a probe head having a corresponding flat surface. The flat surface 40 of the probe head mount 14 illustrated in FIG. 2 has a recess formed therein that receives the ribs 28 formed on the probe head 12 of FIG. 1. The recess in the flat surface is not an essential element of the probe head mount 14 and it may be excluded from the mount or modified, such as a concave recess or the like, to fit a particular type of probe head design. Extending from the flat surface 40 is an substantially round second surface 42 having at least a first groove 44 formed in the surface. The groove is preferably concave in form and sized to accept the highly elastic, high hoop strength retention member 18. In the preferred embodiment of the invention, a second groove is formed in the second surface 42 to accept a second retention member 18. A taper 46 is formed in the first and second surfaces 40, 42 at one end of the probe head mount. At the other end of the mount 14, the second rounded surface 42 extends over the first flat surface 40 forming a upward extending transition 48 from the flat surface 40 and a rounded end 50 on the mount 14. A bore 52 is formed in the mount 14 from the rounded end 50 that receives the attachment member 16. Opposing slots 54 are formed on either side of the probe head mount 14 that intersect the bore 52. The attachment member 16 includes a spring 56 and a shaft 58 that are inserted into the bore 52. The shaft 58 has an aperture 60 formed therethrough that receives a pin 62 inserted through the slots 54 for securing the attachment member 16 to the probe head mount 14.

In the embodiment of FIG. 2, the other end of the shaft 58 that extends from the probe head mount 14 is terminated in a substantially spherical member 64. The spherical member 64 is received in a complementary holder 66 disposed at the end of the probing arm 68. Locking facilities are provided in the probing arm that locks the probe head holder 10 in the probing arm 68.

Figure 3:
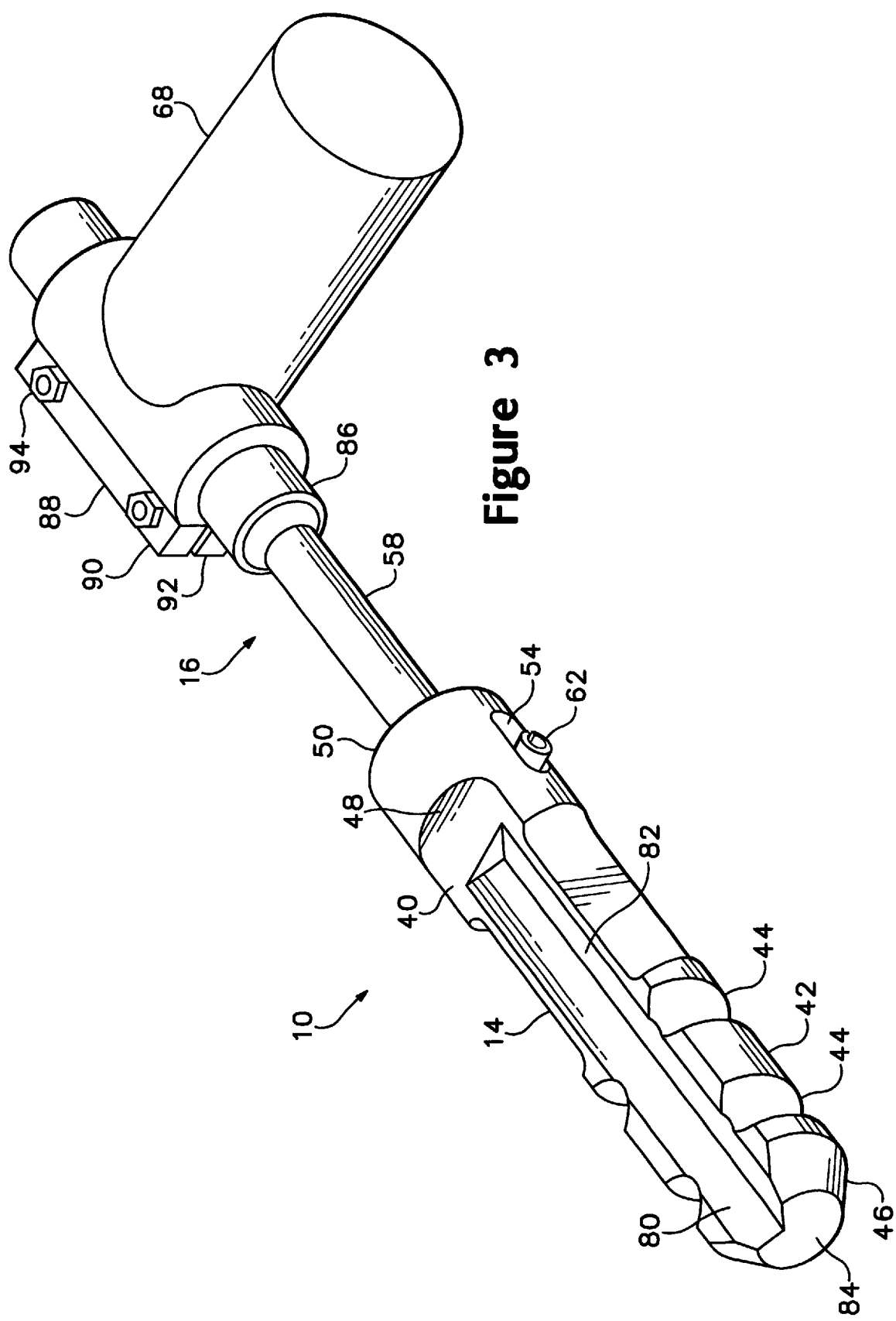
FIG. 3 is a perspective view of an alternative probe head holder according to the present invention.

Referring to FIG. 3, there is illustrated a further embodiment of the probe head holder 10 of the present invention. Like elements in FIG. 3 are labeled the same as those in FIGS. 1 and 2. The first surface 40 of the probe head mount 14 has angled surfaces 80 and 82 that form a groove 84 in the first surface 40. The probe head 12 is positioned in the groove 84 with two of the flat surfaces of the rectangular probe head disposed against the angles surfaces 80 and 82. The substantially round second surface 42 extends from the first surface 40 and has grooves 44 formed in the surface. The groove accept the highly elastic, high hoop strength retention member 18. The probe head mount includes the taper 46 with the grooved first surface extending to the end of the taper. The upward extending transition 48 is formed by the second rounded surface extending over the first surface 40. The bore 52 (not sown) is formed in the mount 14 from the rounded end 50 that receives the attachment member 16. Opposing slots 54 are formed on either side of the probe head mount 14 that intersect the bore 52. The attachment member 16 includes the previously described spring 56 and shaft 58 that are inserted into the bore 52. The attachment member 16 is secured to the probe head mount 14 by the pin 62 inserted through the slots 54 and into the shaft aperture 60.

In the embodiment of FIG. 3, the other end of the shaft 58 that extends from the probe head mount 14 is terminated in a elongate tubular shaped member 86. The tubular shaped member 86 is received in a clamping member 88 disposed at the end of the probing arm 68. The clamping member has first and second clamping elements 90 and 92 with the clamping elements 90 and 92 having aligned threaded apertures. Screws 94 are threaded into the apertures with the screws tightening the clamping elements together to secure the tubular shaped member 86 of the attachment member 16 to the probing arm 68.

Figure 4:
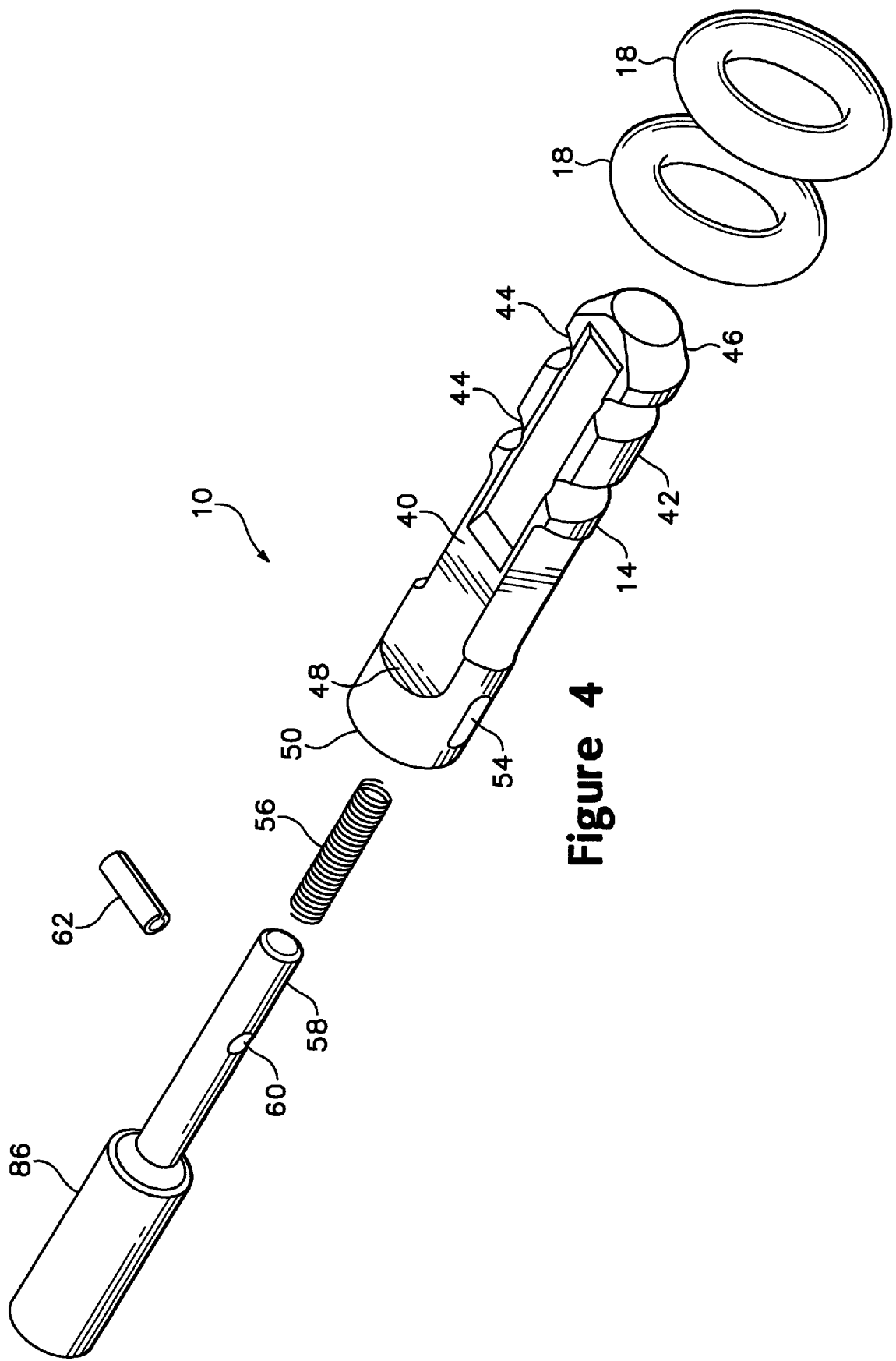
FIG. 4 is an exploded perspective view of the probe head holder according to the present invention.

Referring to FIG. 4, there is shown an exploded perspective view of the probe head holder of the present invention. Like elements in FIG. 4 are labeled the same as in the previous drawing figures. The probe head mount 14 is preferable formed of a rigid material, such as ABS plastic, aluminum or the like. The probe head mount has an overall length of approximately 2.00 inches and a diameter at the circular end 50 of 0.400 inches. The first surface has an approximate length of 1.600 inches and a width of 0.400 inches. The upward extending transition has a height of 0.150 inches. The slots 54 formed in the mount 14 have an overall length of 0.250 inches and a height of 0.100 inches. The tapered end of the mount 14 has a length of approximately 0.200 inches and diameter of approximately 0.350 inches at the large end and a diameter of 0.200 inches at the smaller end. The grooves 44 formed in the second surface 42 have a width of approximately 0.170 inches and a height of approximately 0.050 inches. In the embodiment where more than one retention member 18 is used, the center to center separation of the grooves is 0.400 inches.

The highly elastic, high hoop strength retention member 18 is formed of an elastomer material, such as latex rubber or the like. The retention member 18 is preferably a castration ring that is used for neutering cattle or sheep. Such rings are sold by Livestock Supply, Aurora, Colo. Castration rings are highly elastic allowing them to be easily placed over the probe head mount and probe head using an expansion tool that is well known in the cattle and sheep industry. The cross-linked latex rubber chains provides the high hoop strength for the castration rings that allow them to return to their original shape without losing their elasticity. This trait is different from regular rubber bands and the like that loose some of their elasticity on being stretched. The castration ring 18 allows the probe head 12 to rotate in the plane of the first surface 40 to place the probing tips 20, 22 on the device under test. The high hoop strength of the castration ring 18 applies sufficient pressure on the probe head to hold it firmly on the probe head mount.

The bore 52 in the probe head mount 14 has an approximate length of 1.400 inches and a diameter of 0.150 inches. The spring 56 has a length of approximately 1.00 inches. The length of the shaft 58 is approximately 1.00 inches with approximately 0.40 inches extending from the end of the probe head mount 14. The diameter of the shaft 58 is approximately 0.140 inches with the shaft aperture 60 having a diameter of 0.10 inches. The pin 62 has a length of approximately 0.30 inches. The dimension given for the probe head holder 10 are exemplary and other dimension may be used without departing from the scope of the invention as set forth in the claims.

A probe head holder for a measurement probe head has been described having a probe head mount and an attachment member extending from the mount for attaching to a probing arm of a probing system. A highly elastic, high hoop strength retention member is positioned over the probe head mount and the measurement probe head to flexibly secure the probe head to the mount. The retention member is preferably a castration ring as used in the cattle and sheep industry.

It will be obvious to those having skill in the art that many changes may be made to the details of the above-described embodiments of this invention without departing from the underlying principles thereof. The scope of the present invention should, therefore, be determined only by the following claims.

What is claimed is:

1. A probe head holder for a measurement probe head attachable to a probing arm comprising:

a probe head mount having a first surface adapted to receive the measurement probe head and a second surface extending from the first surface having at least a first groove formed therein normal to the first surface; and at least a first highly elastic, high hoop strength retention member disposed around the probe head mount with a first portion disposed within the first groove in the probe head mount and a second portion disposed around the measurement probe head to flexibly secure the probe head to the mount.

2. The probe head holder as recited in claim 1 wherein the first surface is substantially flat.

3. The probe head holder as recited in claim 1 wherein the first surface has angled surfaces forming a groove for receiving the probe head.

4. The probe head holder as recited in claim 1 wherein the second surface is substantially round.

5. The probe head holder as recited in claim 1 wherein the highly elastic, high hoop strength retention member comprises an elastomer ring.

6. The probe head holder as recited in claim 1 wherein the elastomer ring comprises a castration ring.

7. The probe head holder as recited in claim 1 wherein the probe head mount has proximate and distal ends with the second surface extending over the first surface at the proximate end forming a transition extending upward from and normal to the first surface and the first and second surfaces tapering from a first dimension to a smaller second dimension at the distal end.

8. The probe head holder as recited in claim 5 further comprising an attachment member disposed at the proximate end of the probe head mount and received in the probing arm.

9. The probe head holder as recited in claim 8 wherein the attachment member further comprises a shaft having an aperture formed therethrough that is received in a bore formed in the proximate end of the probe head mount that is parallel to the ends of the mount with slots formed on either side of the probe head mount that intersect the bore and a spring disposed within the bore that engages the shaft to provide an axial spring force for the mount and a pin disposed in the shaft aperture that engages the slots for securing the attachment member to the mount.

10. The probe head holder as recited in claim 1 further comprising a second groove formed in the second surface normal to the first surface and a second highly elastic, high hoop strength retention member disposed around the probe head mount with a first portion disposed within the second groove in the probe head mount and a second portion disposed against the measurement probe head to flexibly secure the probe head to the mount.

11. The probe head holder as recited in claim 10 wherein the highly elastic, high hoop strength retention member comprises an elastomer ring.

12. The probe head holder as recited in claim 11 wherein the elastomer ring comprises a castration ring.

13. A probe head holder for a measurement probe head attachable to a probing arm comprising:

an elongate probe head mount having an elongate flat surface adapted to receive the measurement probe head and an approximately circular surface extending from the elongate surface having at least a first groove formed therein normal to the elongate surface; and at least a first castration ring disposed around the probe head mount with a first portion disposed within the first groove in the probe head mount and a second portion disposed around the measurement probe head to flexibly secure the probe head to the mount.

14. The probe head holder as recited in claim 13 wherein the elongate flat surface has first and second angled surfaces forming a groove for receiving the probe head.

15. The probe head holder as recited in claim 13 wherein the probe head mount has proximate and distal ends with the circular surface extending over the elongate flat surface at the proximate end forming a transition extending upward from and normal to the flat surface and the flat and circular surfaces tapering from a first dimension to a smaller second dimension at the distal end.

16. The probe head holder as recited in claim 15 further comprising an attachment member having a shaft with an aperture formed therethrough that is received in a bore formed in the proximate end of the probe head mount that is parallel to the ends of the mount with slots formed on either side of the probe head mount that intersect the bore and a spring disposed within the bore that engages the shaft to provide an axial spring force for the mount and a pin disposed in the shaft aperture that engages the slots for securing the attachment member to the mount.

17. The probe head holder as recited in claim 13 further comprising a second groove formed in the circular surface normal to the flat surface and a second castration ring disposed around the probe head mount with a first portion disposed within the second groove in the probe head mount and a second portion disposed against the measurement probe head to flexibly secure the probe head to the mount.

* * * * *